(12) United States Patent
Park et al.

(10) Patent No.: US 10,128,224 B2
(45) Date of Patent: Nov. 13, 2018

(54) CIRCUIT BOARDS AND SEMICONDUCTOR PACKAGES INCLUDING PROTRUDING PATTERN ON SUBSTRATE

(71) Applicant: Samsung Electronics Co., Ltd., Suwon-si (KR)

(72) Inventors: Dong-Sik Park, Suwon-si (KR); Dong-Wan Kim, Hwaseong-si (KR); Jung-Hoon Han, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/644,417

(22) Filed: Jul. 7, 2017

(65) Prior Publication Data

US 2018/0033779 A1    Feb. 1, 2018

(30) Foreign Application Priority Data

Jul. 29, 2016 (KR) .................. 10-2016-0097150

(51) Int. Cl.
*H01L 23/544*    (2006.01)
*H01L 25/18*    (2006.01)
(Continued)

(52) U.S. Cl.
CPC ............. *H01L 25/18* (2013.01); *H01L 23/13* (2013.01); *H01L 23/3128* (2013.01); *H01L 23/49816* (2013.01); *H01L 23/49827* (2013.01); *H01L 23/5381* (2013.01); *H01L 23/5384* (2013.01); *H01L 23/5385* (2013.01); *H01L 23/5386* (2013.01); *H01L 23/544* (2013.01); *H01L 25/0657* (2013.01); *H01L 25/50* (2013.01); *H01L 21/561* (2013.01); *H01L 21/568* (2013.01); *H01L 2223/5442* (2013.01); *H01L 2223/5446* (2013.01); *H01L 2223/54426* (2013.01); *H01L 2223/54486* (2013.01); *H01L 2224/0401* (2013.01);
(Continued)

(58) Field of Classification Search
CPC ..................................................... H01L 23/544
See application file for complete search history.

(56) References Cited

U.S. PATENT DOCUMENTS 7,820,459 B2    10/2010    Tan et al.
8,569,899 B2 *  10/2013    Zhang .................... H01L 22/34
                                                     257/71
(Continued)

FOREIGN PATENT DOCUMENTS

KR    10-2001-0003670 A    1/2001
KR    10-2014-0020507 A    2/2014

*Primary Examiner* — Quoc Hoang
(74) *Attorney, Agent, or Firm* — Muir Patent Law, PLLC

(57) ABSTRACT

A circuit board comprises a mother substrate including first and second scribing regions, the first scribing region extending in first direction, the second scribing region extending in second direction, the first and second directions crossing each other, the mother substrate including chip regions defined by the first and second scribing regions, and a through via penetrating the chip regions of the mother substrate. The mother substrate comprises a first alignment pattern protruding from a top surface of the mother substrate. The first alignment pattern is disposed on at least one of the scribing regions.

19 Claims, 15 Drawing Sheets

(51) Int. Cl.
*H01L 23/13* (2006.01)
*H01L 23/31* (2006.01)
*H01L 23/498* (2006.01)
*H01L 23/538* (2006.01)
*H01L 25/065* (2006.01)
*H01L 25/00* (2006.01)
*H01L 21/56* (2006.01)

(52) U.S. Cl.
CPC ............... *H01L 2224/0557* (2013.01); *H01L 2224/06181* (2013.01); *H01L 2224/16148* (2013.01); *H01L 2224/16227* (2013.01); *H01L 2224/16235* (2013.01); *H01L 2224/81005* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06548* (2013.01); *H01L 2225/06586* (2013.01); *H01L 2225/06593* (2013.01); *H01L 2924/1431* (2013.01); *H01L 2924/1432* (2013.01); *H01L 2924/1434* (2013.01); *H01L 2924/15192* (2013.01); *H01L 2924/15311* (2013.01)

(56) References Cited

U.S. PATENT DOCUMENTS

| | | | |
|---|---|---|---|
| 8,592,952 | B2 | 11/2013 | Jo et al. |
| 8,659,300 | B2 | 2/2014 | Finch et al. |
| 8,896,136 | B2 | 11/2014 | Tsai et al. |
| 8,928,159 | B2 | 1/2015 | Chang et al. |
| 8,957,526 | B2 | 2/2015 | Chun et al. |
| 9,029,986 | B2 | 5/2015 | Green et al. |
| 9,070,748 | B2 | 6/2015 | Kang et al. |
| 9,691,685 | B2 * | 6/2017 | Lee ............ H01L 23/481 |
| 9,786,580 | B2 * | 10/2017 | Yang .......... H01L 23/481 |
| 2015/0287683 | A1 | 10/2015 | Moon et al. |
| 2016/0079208 | A1 | 3/2016 | Heo et al. |

\* cited by examiner

CIRCUIT BOARDS AND SEMICONDUCTOR PACKAGES INCLUDING PROTRUDING PATTERN ON SUBSTRATE

CROSS-REFERENCE TO RELATED APPLICATIONS

This U.S. nonprovisional patent application claims priority under 35 U.S.C § 119 to Korean Patent Application 10-2016-0097150 filed on Jul. 29, 2016, with the Korean Intellectual Property Office, the entire contents of which are hereby incorporated by reference.

BACKGROUND

The present disclosure relates to a semiconductor package, for example, a circuit board having an alignment pattern and a semiconductor package having a protrusion pattern.

The development of electronic industry may provide low price electronic products having beneficial characteristics such as light weight, compact size, high speed and high performance. Semiconductor packages are provided to implement an integrated circuit chip to be suitable for use in an electronic product. Various research has been performed to enhance performance of the semiconductor package.

Three-dimensional packages have been developed to implement a through via (TSV) technique so as to meet the requirement of high performance in stack-type packages fabricated by a wire bonding technique. The three-dimensional packages may be fabricated to vertically stack multi-functional devices so that it may be possible to accomplish high memory capacity, low power consumption, high transmission rate, and high efficiency. A HBM (High bandwidth Memory) is one of the three-dimensional packages that has a structure in which memory chips are stacked like CPU or SOC using an interposer with TSVs.

SUMMARY

Embodiments of the present inventive concept provide a circuit board and a semiconductor package obtained by simplified fabrication processes.

The present inventive concept, however is not limited to the above-mentioned embodiments, other embodiments which have not been mentioned above will be clearly understood to those skilled in the art from the following description.

According to an exemplary embodiment of the present inventive concept, a circuit board comprises: a mother substrate including first and second scribing regions, the first scribing region extending in first direction, the second scribing region extending in second direction, the first and second directions crossing each other, the mother substrate including chip regions defined by the first and second scribing regions; and a through via penetrating the chip regions of the mother substrate, wherein the mother substrate comprises a first alignment pattern protruding from a top surface of the mother substrate, the first alignment pattern being disposed on at least one of the scribing regions.

According to an exemplary embodiment of the present inventive concept, a semiconductor package comprises: a first semiconductor chip including a mother substrate and a through via penetrating the mother substrate; and a second semiconductor chip on the first semiconductor chip, wherein the mother substrate comprises a protrusion pattern that is disposed on a corner portion of the mother substrate and protrudes from a top surface of the mother substrate.

According to an example embodiment of the present disclosure, a semiconductor device comprises: a first semiconductor chip comprising a first substrate, a protruding pattern protruding on the first substrate, and a first integrated circuit formed on the first substrate; and a second semiconductor chip comprising a second substrate and a second integrated circuit formed on the second substrate, wherein the second semiconductor chip is disposed on the first semiconductor chip, wherein the first integrated circuit is electrically coupled to the second integrated circuit, wherein the protruding pattern is formed from the same material as the first substrate, and wherein the protruding pattern is at one or more corners of the first semiconductor chip and is not formed at edge portions of the first semiconductor chip between the corners of the semiconductor chip.

DETAILED DESCRIPTION

Figure 1:
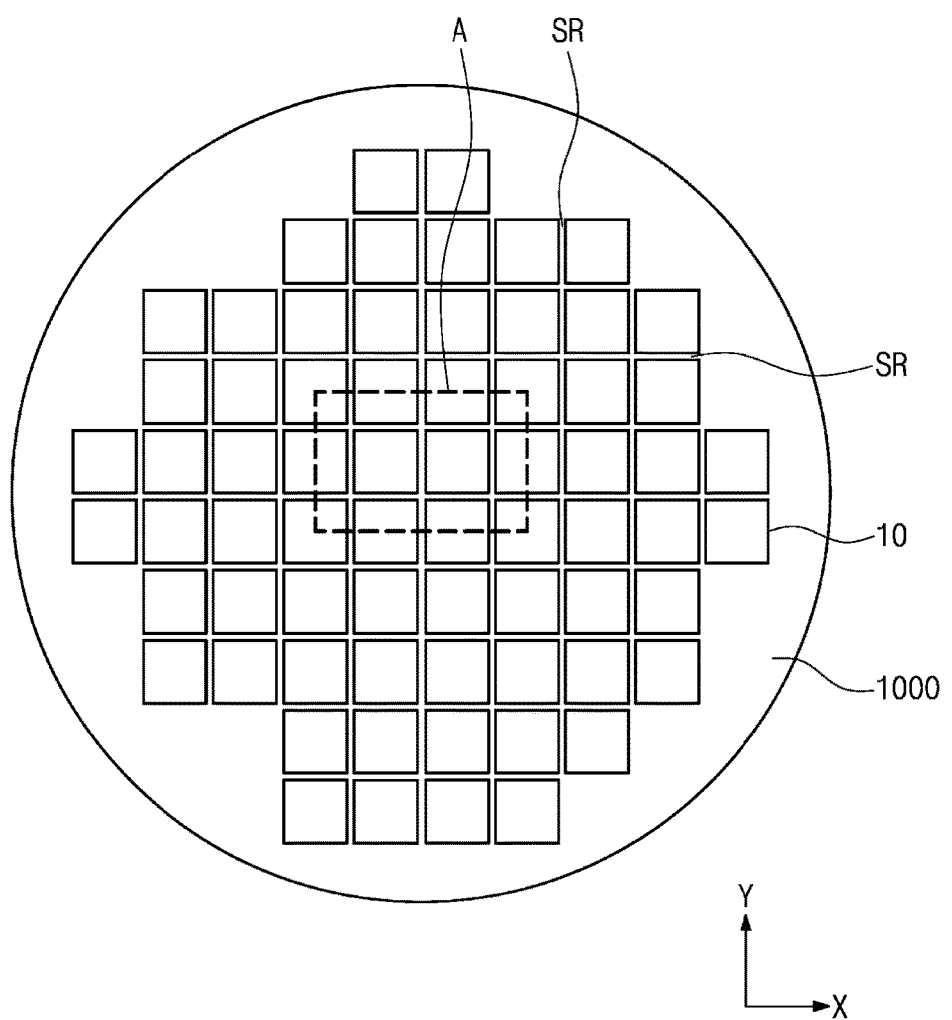
FIG. 1 is a plan view roughly illustrating a circuit board including semiconductor chips according to exemplary embodiments of the present inventive concept.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Figure 2:
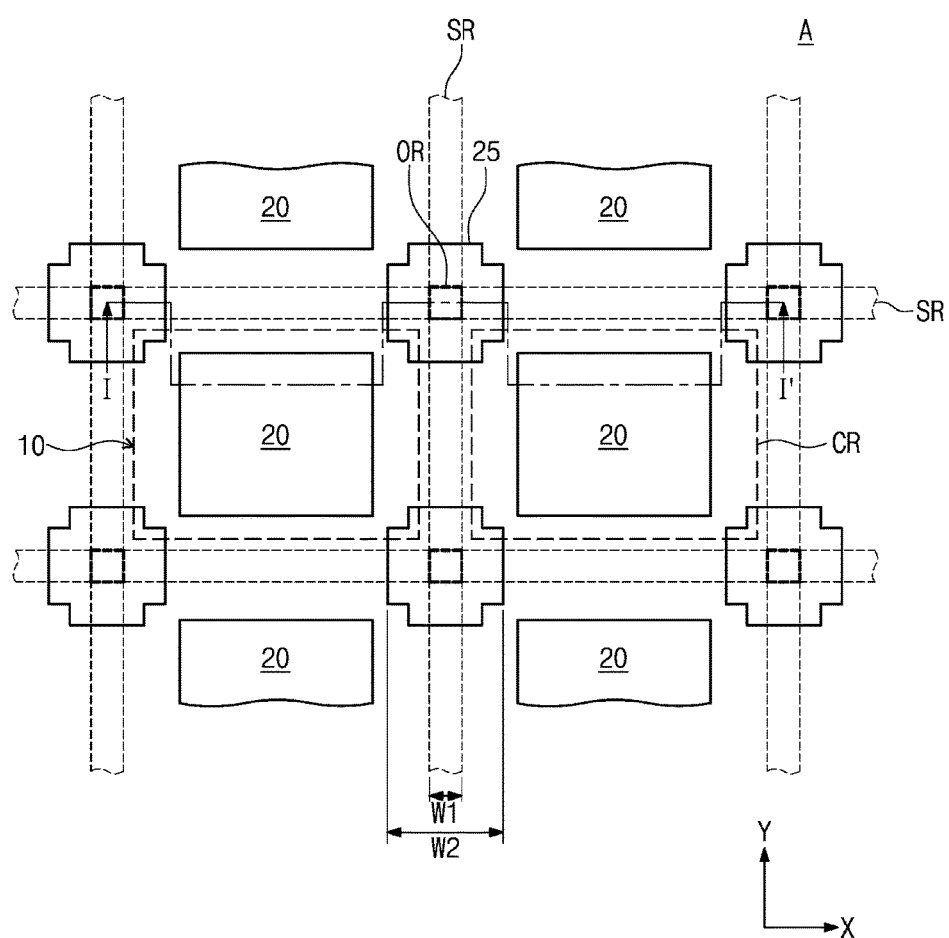
FIG. 2 is an enlarged view of section A shown in FIG. 1.
Figure 3:
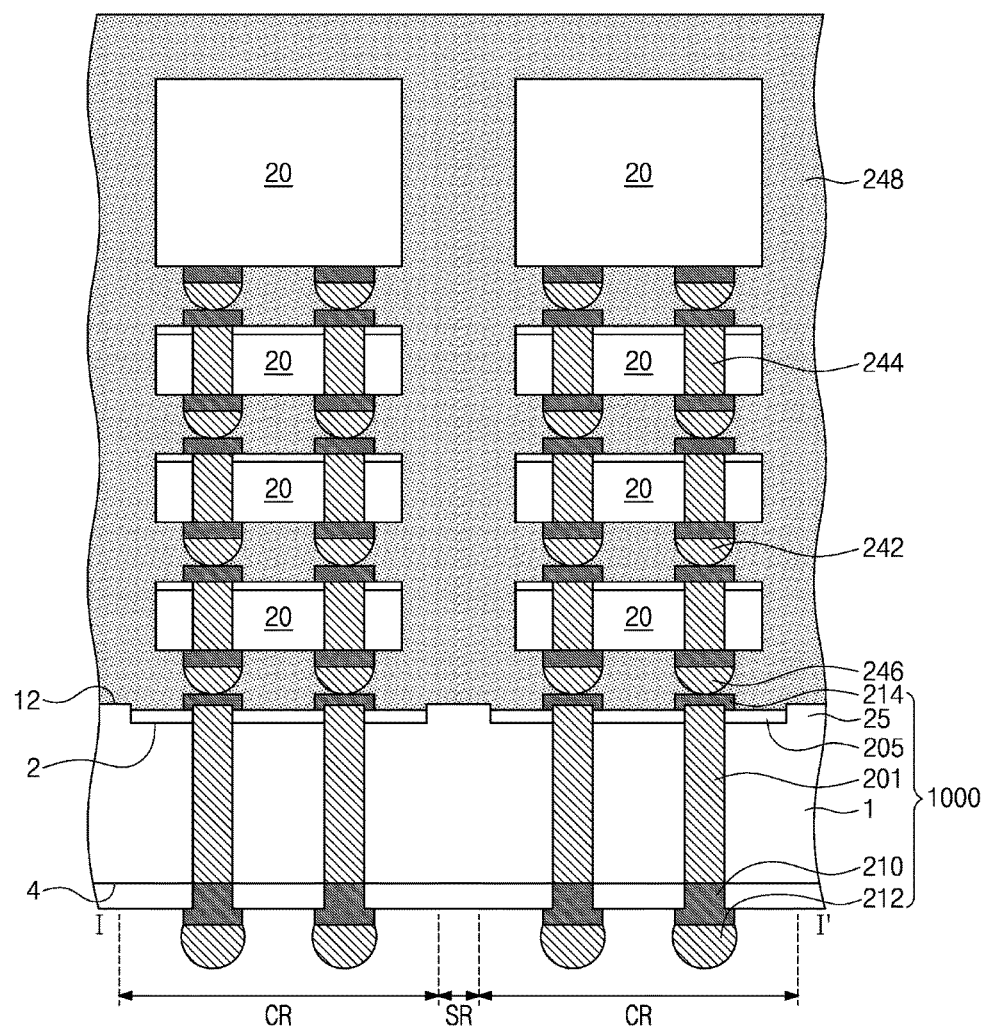
FIG. 3 is a cross-sectional view taken along line I-I' of FIG. 2 illustrating a circuit board including semiconductor chips according to exemplary embodiments of the present inventive concept.
Figure 4A:
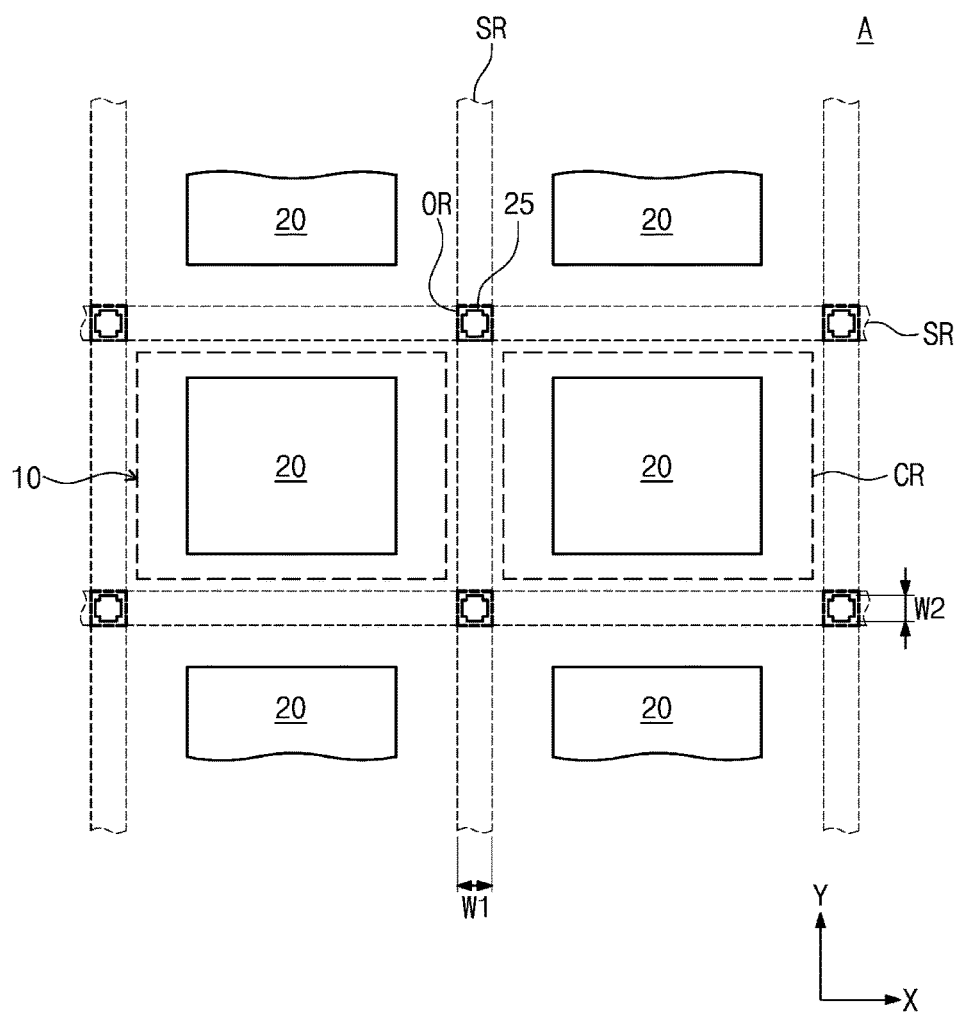
FIGS. 4A and 4B show other examples of FIG. 2.
Figure 4B:
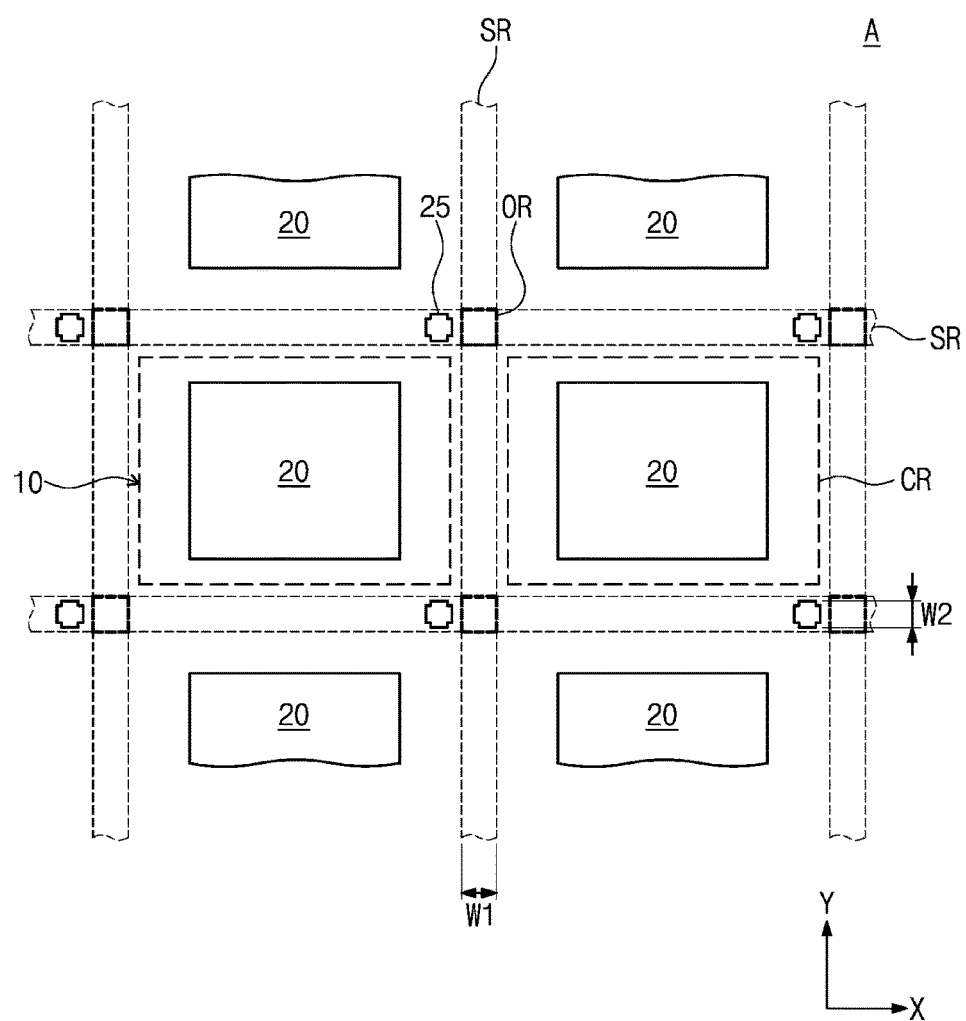

FIG. 1 is a plan view roughly illustrating a circuit board including semiconductor chips according to exemplary embodiments of the present inventive concept. FIG. 2 is an enlarged view of section A shown in FIG. 1. FIG. 3 is a cross-sectional view taken along line I-I' of FIG. 2 illustrating a circuit board including semiconductor chips according to exemplary embodiments of the present inventive concept. FIGS. 4A and 4B show other examples of FIG. 2.

Referring to FIGS. 1, 2 and 3, a circuit board 1000 may include a mother substrate 1, first through vias 201, an insulation pattern 205, lower pads 210, upper pads 214, and terminals 212. The mother substrate 1 may include a first surface 2 and a second surface 4 opposite each other. The first surface 2 may be a top surface of the mother substrate 1, and the second surface 4 may be a bottom surface of the mother substrate 1. A circuit, such as an integrated circuit (not shown) electrically connected to first semiconductor chips 10 may be disposed on the first surface 2 and/or the second surface 4 of the mother substrate 1. The mother substrate 1 may be, for example, a silicon substrate (e.g., a bulk silicon wafer). Alternatively, the mother substrate 1 may be a printed circuit board. For example, the first semiconductor chips 10 may include respective portions of the mother substrate 1. For example, the first semiconductor chips 10 may be at least partially formed of respective portions of the mother substrate 1. For example, the first semiconductor chips 10 may include active regions and/or source/drain regions of semiconductor devices (e.g., transistors), and the active regions and/or the source/drain regions may be formed with the mother substrate 1. For example, a mother substrate 1 may be formed of a continuous, and/or homogeneous bulk material, e.g., throughout the mother substrate, and various circuits may be formed on and/or in the mother substrate 1. For example, the first semiconductor chips 10 may include a bulk material portion of the mother substrate 1 and circuitry formed in and/or on the bulk material portion of the mother substrate 1.

The mother substrate 1 may include scribing regions SR extending in a first direction X and a second direction Y, chip regions CR defined by the scribing regions SR, and intersection regions OR where the scribing regions SR cross each other. The scribing regions SR may include the intersection regions OR. A scribing region SR may be a region configured to be cut within the scribing region SR so that the mother substrate 1 is divided by the scribe line. For example, the mother substrate 1 may be divided into chips by a blade or a laser that cuts the scribing regions SR. In certain embodiments, boundaries of the scribing regions SR may be marked by scribing marks. In an embodiment, the circuit board 1000 may include the first semiconductor chips 10. The first semiconductor chips 10 may be arranged in the first direction X and the second direction Y. The first semiconductor chips 10 may include the mother substrate 1 and semiconductor devices (not shown). The semiconductor devices may be disposed on the chip regions CR of the mother substrate 1. For example, each of the chip regions CR of the mother substrate 1 may be defined as a single semiconductor chip 10. In some embodiments, the semiconductor devices may be logic devices. The first semiconductor chips 10 may therefore be a semiconductor logic chip.

The mother substrate 1 may include alignment patterns 25. For example, the alignment patterns 25 may be a portion of the mother substrate 1. For example, the alignment patterns 25 may be formed of silicon included in a bulk silicon mother substrate 1, and may be formed continuously of the same material as the bulk silicon mother substrate 1. The alignment patterns 25 may protrude from the first surface 2 of the mother substrate 1. For example, the alignment patterns 25 may protrude from a base substrate portion of the bulk silicon mother substrate, the base portion including a portion at and below a vertical level of the first surface 2 of the mother substrate 1. Therefore, top surfaces 12 of the alignment patterns 25 may be positioned higher than the first surface 2 of the mother substrate 1. The alignment patterns 25 may be disposed on the scribing regions SR of the mother substrate 1. The alignment patterns 25 may have various shapes such as a cross shape, a rectangular shape, or a polygonal shape. In a process for stacking second semiconductor chips 20 on the chip regions CR of the mother substrate 1, the alignment patterns 25 may serve as a reference mark for aligning the first through vias 201 with lower solder balls 246 adhered to a bottom surface of a lowermost second semiconductor chip 20.

The alignment patterns 25 may have a various size and be freely disposed on the scribing regions SR. For example, as shown in FIG. 2, maximum widths W2 of the alignment patterns 25 may be greater than widths W1 of the scribing regions SR (W2>W1). The alignment patterns 25 may be disposed, for example, on the chip regions CR. Alternatively, the maximum widths W2 of the alignment patterns 25 may be substantially the same as or less than the widths W1 of the scribing regions SR (W2<W1, or W2=W1). As shown in FIG. 4A, the alignment patterns 25 may be locally disposed on the intersection regions OR. For example, the alignment patterns 25 may be disposed within the respective intersection regions OR. Alternatively, as shown in FIG. 4B, the alignment patterns 25 may be disposed on the scribing regions SR while being spaced apart from the intersection regions OR. For example, the alignment patterns 25 may be disposed outside the intersection regions OR and/or within the scribing regions SR. In one embodiment, each one of the alignment patterns 25 has the same shape and size as each other.

Referring back to FIGS. 2 and 3, an insulation pattern 205 may be disposed on the first surface 2 of the mother substrate 1. The insulation pattern 205 may have a thickness less than those of the alignment patterns 25. The thickness of the alignment pattern 25 may correspond to a distance between the first surface 2 of the mother substrate 1 and a top surface 12 of the alignment pattern 25. For example, the thickness of the insulation pattern 205 may be less than the vertical distance between the first surface 2 and the top surface 12 of an alignment pattern 25. The insulation pattern 205 may have a top surface positioned lower than the top surfaces 12 of the alignment patterns 25. As the top surfaces 12 of the alignment patterns 25 have a height level different from that of the top surface of the insulation pattern 205, it may be possible to identify shapes of the alignment patterns 25 on the insulation pattern 205. The insulation pattern 205 may include, for example, a silicon oxide layer.

The first through vias 201 may be disposed to penetrate the mother substrate 1 and the insulation pattern 205. The first through vias 201 may be disposed in the chip regions CR. For example, as shown in figures, the first through vias 201 may have a top surface positioned higher than the top surface of the insulation pattern 205. For example, the first through vias 201 may have an upper portion protruding from the top surface of the insulation pattern 205. In this case, the top surfaces of the first through vias 201 may be positioned at substantially the same level as the top surfaces 12 of the alignment patterns 25. Alternatively, the top surfaces of the first through vias 201 may be positioned lower than the top surfaces 12 of the alignment patterns 25. In certain embodiments, the top surfaces of the first through vias 201 may be positioned at substantially the same level as the top surface of the insulation pattern 205 (not shown in figures).

The upper pads 214 may be disposed on the first through vias 201. The upper pads 214 may be electrically connected to the first through vias 201. The lower pads 210 may be disposed on the second surface 4 of the mother substrate 1. The lower pads 210 may be electrically connected to the first through vias 201. The terminals 212 may be disposed on the lower pads 210. The terminals 212 may be, for example, external connection terminals for a package, for communicating with an outside of the package. In certain embodiments, an insulation layer may be formed between the lower pads 210 and the second surface 4 of the mother substrate 1 as shown in FIG. 3. For example, an insulation layer may be formed on the second surface 4 of the mother substrate 1, and the lower pads 210 may be formed on the insulation layer.

A plurality of second semiconductor chips 20 may be mounted on the chip region CR. Upper terminals, such as solder balls 242, may be interposed between the second semiconductor chips 20 such that the second semiconductor chips 20 may be joined to each other. Second through vias 244 may penetrate the second semiconductor chips 20. Alternatively, as shown in figures, an uppermost second semiconductor chip 20 may have no second through vias 244 therein. The second semiconductor chips 20 may be electrically connected to each other through the upper solder balls 242 and the second through vias 244. The lower terminals, such as solder balls 246, may be disposed between the upper pads 214 and the lowermost second semiconductor chip 20. The lower solder balls 246 may electrically connect a plurality of the second semiconductor chips 20 to the first semiconductor chips 10. A molding layer 248 may be disposed on the mother substrate 1 and the second semiconductor chips 20. The molding layer 248 may be interposed between the lowermost second semiconductor chip 20 and the mother substrate 1, and may be formed on sidewalls of the second semiconductor chips 20 and a top surface of the uppermost second semiconductor chip 20.

Figure 5:
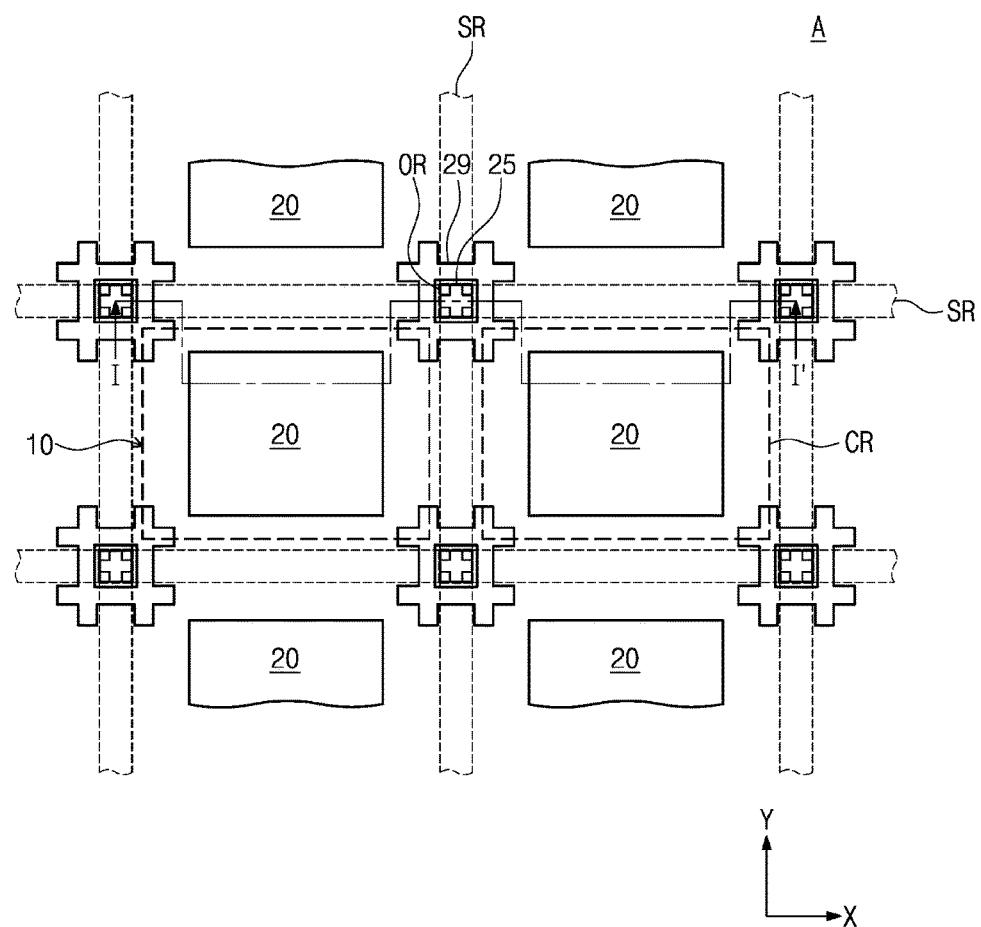
FIG. 5 is an enlarged view of section A of FIG. 1 illustrating a circuit board including semiconductor chips according to exemplary embodiments of the present inventive concept.
Figure 6:
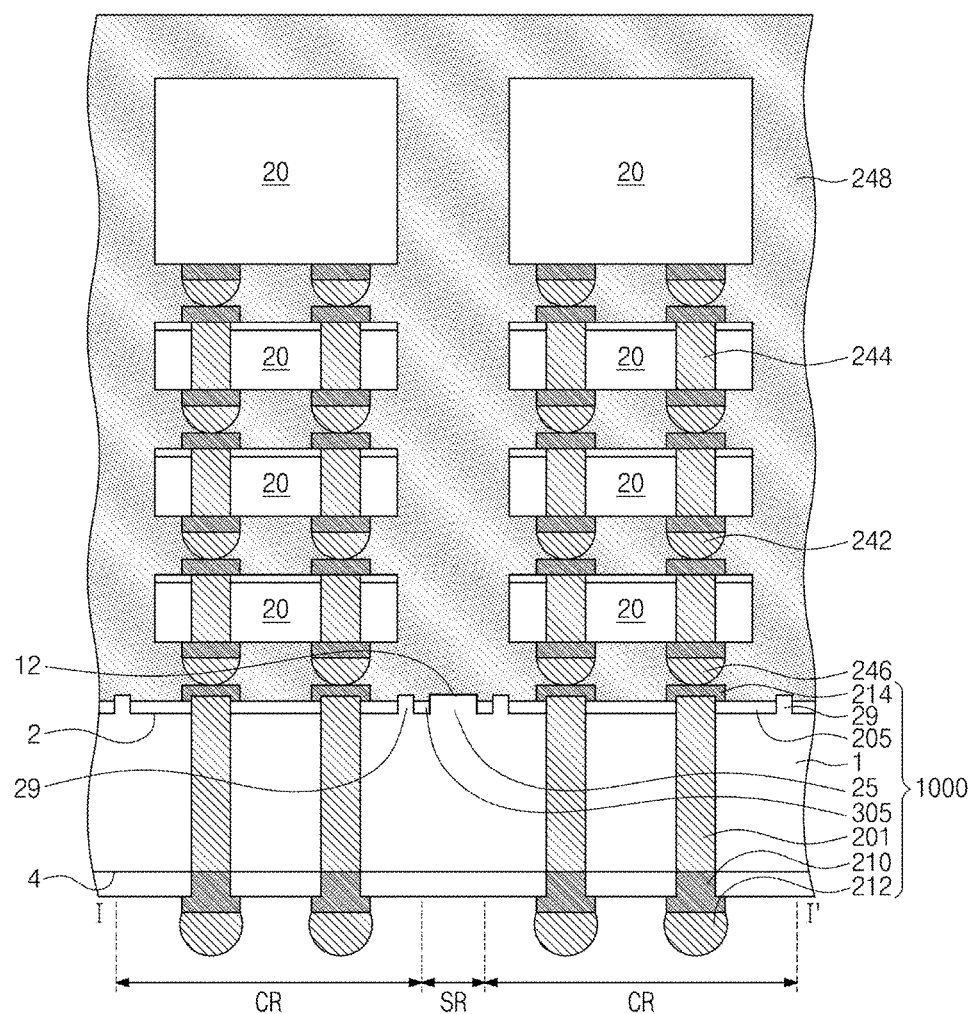
FIG. 6 is a cross-sectional view taken along line I-I' of FIG. 5 illustrating a circuit board including semiconductor chips according to exemplary embodiments of the present inventive concept.
Figure 7A:
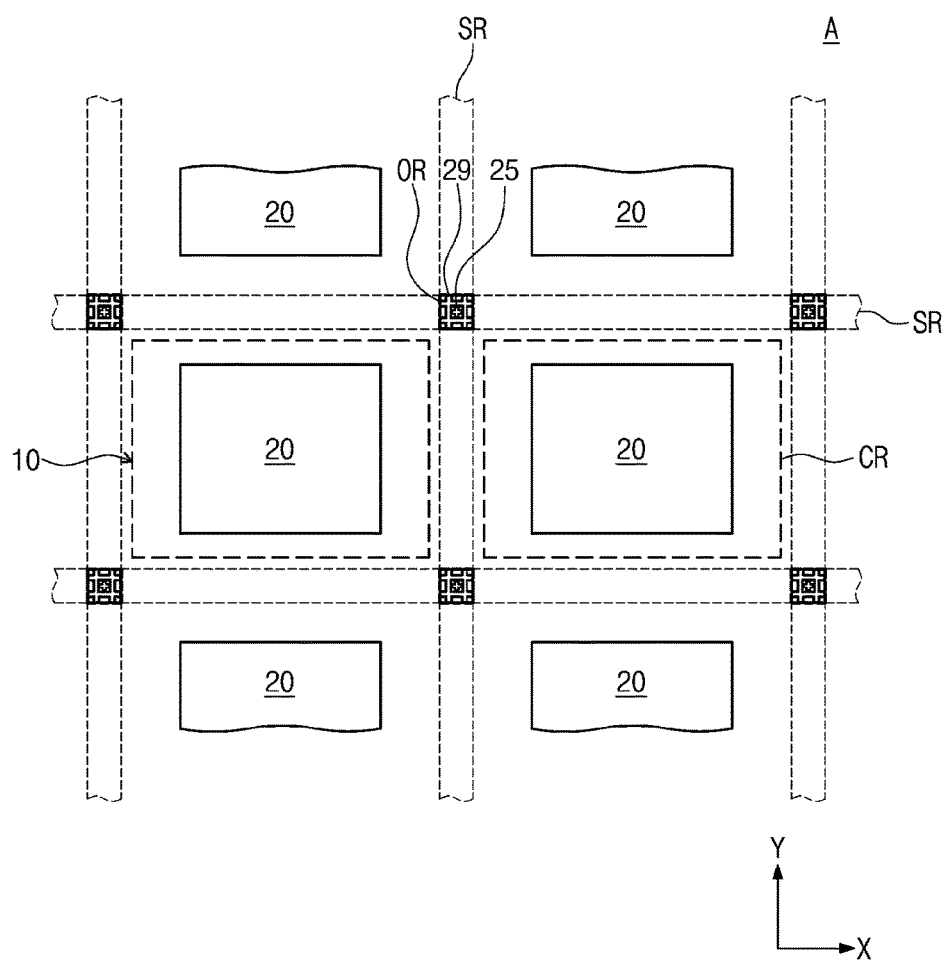
FIGS. 7A and 7B show other examples of FIG. 5.
Figure 7B:
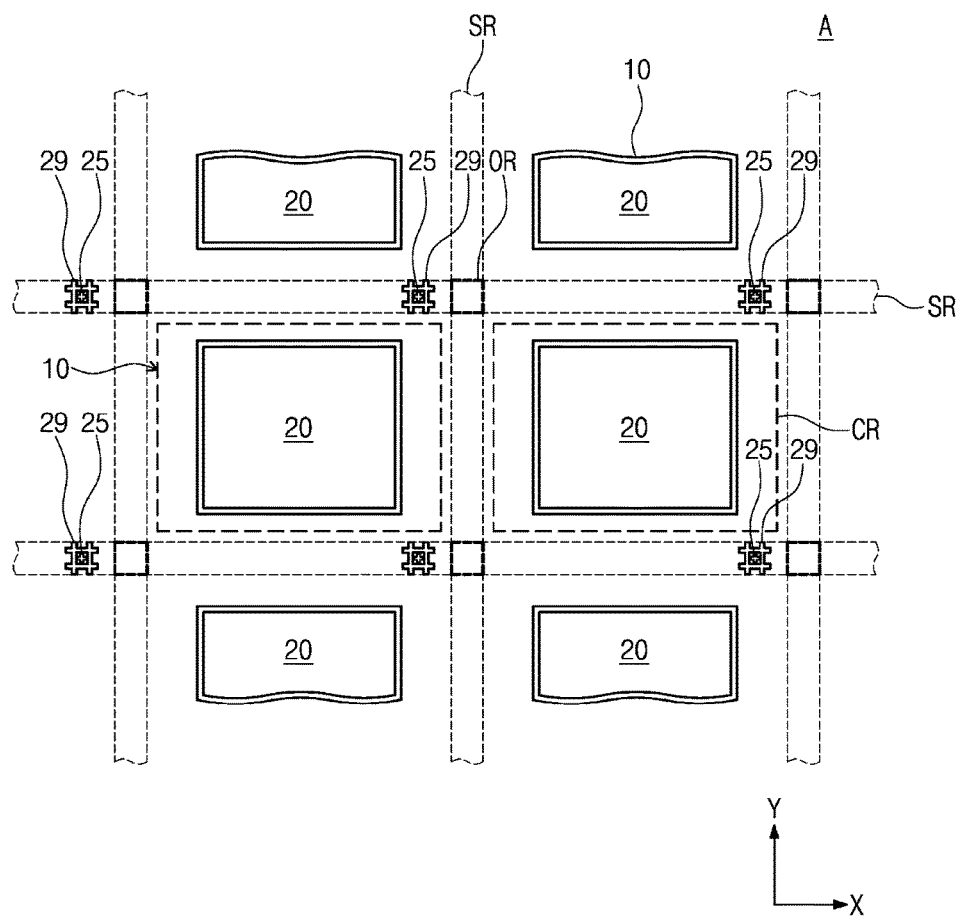

FIG. 5 is an enlarged view of section A of FIG. 1 illustrating a circuit board including semiconductor chips according to exemplary embodiments of the present inventive concept. FIG. 6 is a cross-sectional view taken along line I-I' of FIG. 5 illustrating a circuit board including semiconductor chips according to exemplary embodiments of the present inventive concept. FIGS. 7A and 7B are other exemplary enlarged views of section A of FIG. 1 illustrating a circuit board including semiconductor chips according to exemplary embodiments of the present inventive concept. For brevity of the descriptions, components substantially the same as those of the embodiments illustrated in FIGS. 1 to 3 are allocated the same reference numerals, and a detailed description thereof may be omitted.

Referring to FIGS. 5 and 6, the mother substrate 1 may include additional alignment patterns 29 surrounding the alignment patterns 25. A single alignment pattern 25 may be disposed in and spaced apart from a single additional alignment pattern 29. For example, each of the alignment patterns 25 may be surrounded by an additional alignment pattern 29. For example, the alignment patterns 25 may be separated (not connected) from additional alignment patterns 29. The additional alignment patterns 29 may protrude from the first surface 2 of the mother substrate 1. For example, the additional alignment patterns 29 may be a portion of the mother substrate 1. For example, the additional alignment patterns 29 may be formed of silicon included in a bulk silicon mother substrate 1. Top surfaces of the additional alignment patterns 29 may be positioned at substantially the same level as the top surfaces 12 of the alignment patterns 25. For example, the additional alignment pattern 29 may have a thickness substantially the same as that of the alignment pattern 25. The thickness of the additional alignment patterns 29 may correspond to a distance between the first surface 2 of the mother substrate 1 and the top surface of the alignment pattern 29. The thickness of the additional alignment patterns 29 may be greater than that of the insulation pattern 205. For example, the top surfaces of the additional alignment patterns 29 may be positioned higher than the top surface of the insulation pattern 205. The additional alignment patterns 29 may have a various shape such as a chain shape, a band shape, or a ring shape.

The alignment patterns 25 may have a various size and be freely disposed on the scribing regions SR. For example, as shown in FIG. 5, the alignment patterns 25 may be locally disposed on the intersection regions OR of the mother substrate 1, and the additional alignment patterns 29 may be disposed on the scribing regions SR and the chip regions CR. In one embodiment, each of the alignment patterns 25 have the same shape and size as each other and/or each of the additional alignment patterns 29 have the same shape and size as each other Alternatively, as shown in FIG. 7A, the alignment patterns 25 and the additional alignment patterns 29 may be locally disposed on the intersection regions OR. In certain embodiments, as shown in FIG. 7B, the alignment patterns 25 and the additional alignment patterns 29 may be disposed on the scribing regions SR while being spaced apart from the intersection regions OR.

Referring back to FIGS. 5 and 6, additional insulation patterns 305 may be disposed on the first surface 2 of the mother substrate 1 between the additional alignment patterns 29 and the alignment patterns 25. The additional insulation patterns 305 may be disposed on the scribing regions SR of the mother substrate 1. The additional insulation patterns 305 may have a thickness substantially the same as that of the insulation pattern 205. The additional insulation patterns 305 may have a top surface positioned lower than the top surfaces 12 of the alignment patterns 25 and the top surfaces of the additional alignment patterns 29. The thickness of the additional insulation patterns 305 may be less than those of the alignment patterns 25 and those of the additional alignment patterns 29. The additional insulation patterns 305 may include the same material as the insulation pattern 205. The additional insulation patterns 305 may include, for example, a silicon oxide layer.

Figure 8:
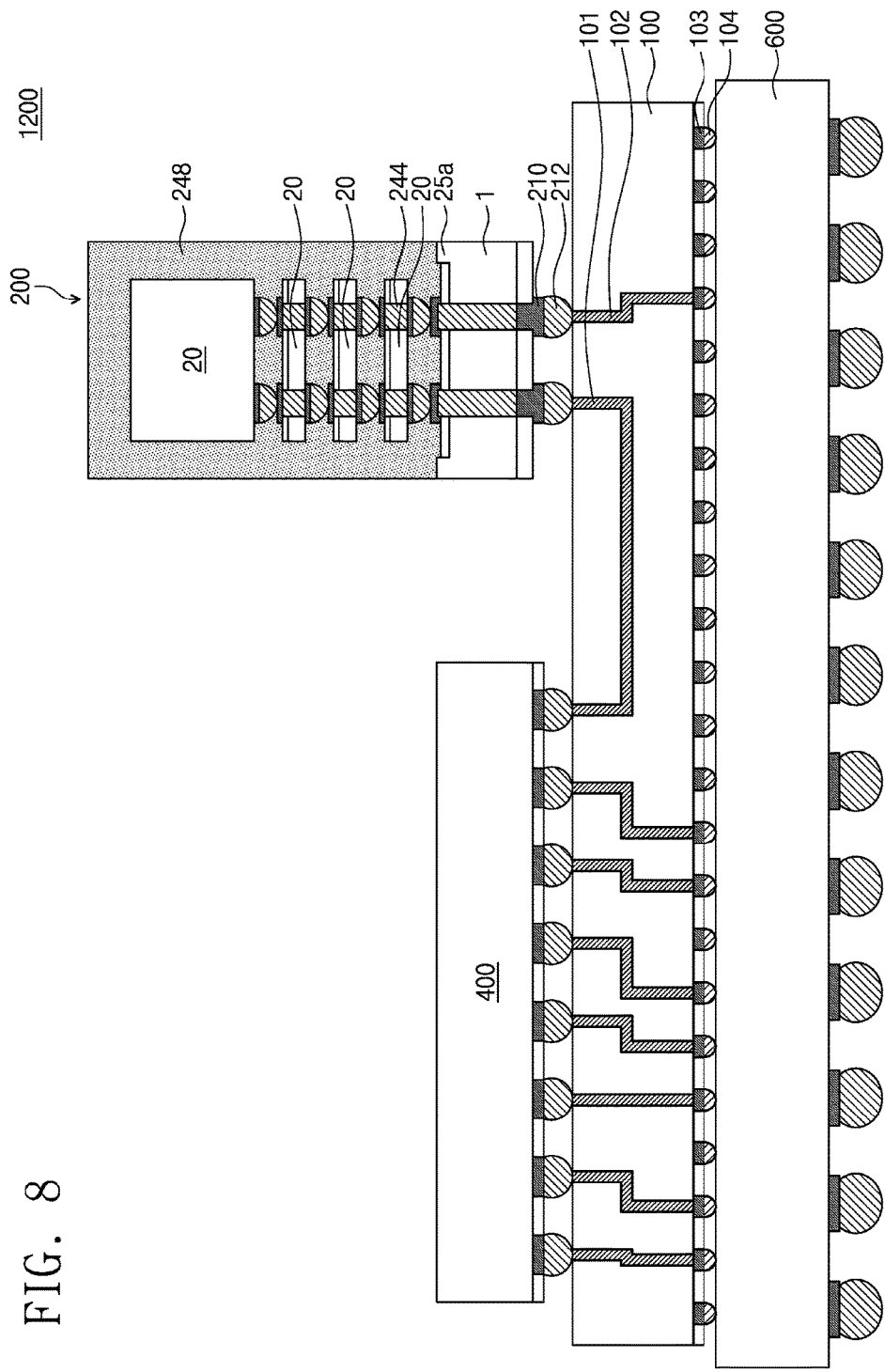
FIG. 8 is a cross-sectional view illustrating a semiconductor package according to exemplary embodiments of the present inventive concept.
Figure 9:
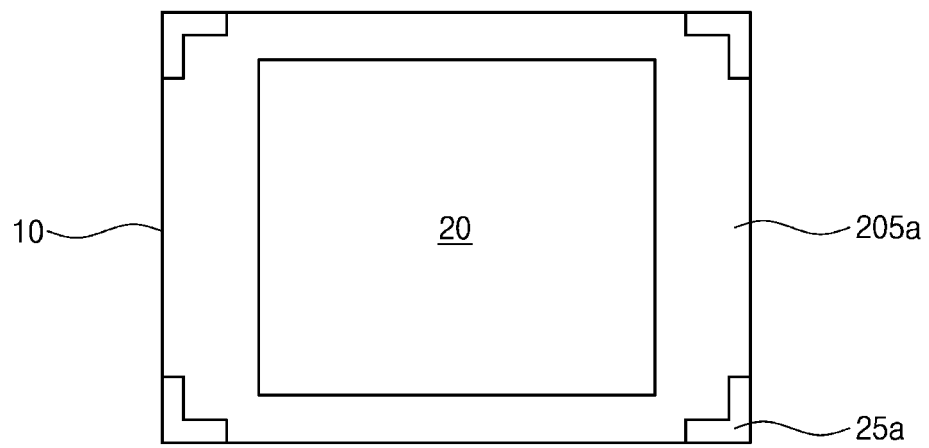
FIG. 9 is a plan view of a chip stack package of FIG. 8.
Figure 10:
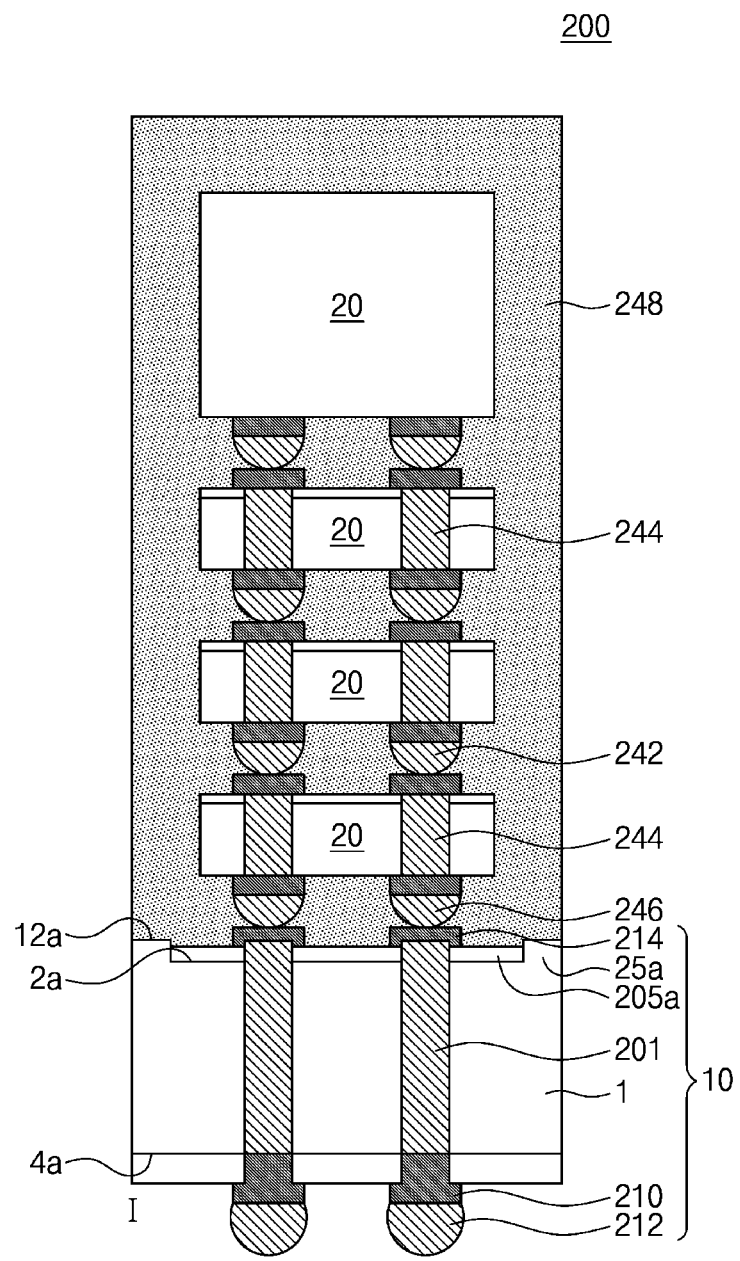
FIG. 10 is a cross-sectional view of a chip stack package of FIG. 8.

FIG. 8 is a cross-sectional view illustrating a semiconductor package according to exemplary embodiments of the present inventive concept. FIG. 9 is a plan view of a chip stack package of FIG. 8. FIG. 10 is a cross-sectional view of a chip stack package of FIG. 8.

Referring to FIG. 8, a semiconductor package 1200 may include an interposer substrate 100, a chip stack package 200, a signal processing device 400, and a package substrate 600. The interposer substrate 100 may be interposed between the chip stack package 200 and the package substrate 600 and between the signal processing device 400 and the package substrate 600. The interposer substrate 100 may electrically connect the chip stack package 200 and the package substrate 600. The interposer substrate 100 may electrically connect the signal processing device 400 and the package substrate 600 The interposer substrate 100 may electrically connect the signal processing device 400 and the chip stack package 200. The interposer substrate 100 may include interconnection lines 101, vias 102, pads 103, and interposer terminals 104. The pads 103 may be disposed on a bottom surface of the interposer substrate 100, and may be in contact with the vias 102. The interposer terminals 104 may be disposed on the pads 103.

Referring to FIGS. 8, 9 and 10, the chip stack package 200 may be mounted on the interposer substrate 100. The chip stack package 200 may include a first semiconductor chip 10 and second semiconductor chips 20 stacked on the first semiconductor chip 10. The first semiconductor chip 10 may include a mother substrate 1, an insulation pattern 205a, first through vias 201, upper pads 214, lower pads 210, and terminals 212. For example, the first semiconductor chip 10 may include a single logic device (not shown) disposed on the mother substrate 1. Alternatively, the first semiconductor chip 10 may include a plurality of logic devices (not shown) disposed on the mother substrate 1, an interlayer insulation structure (not shown) disposed on the logic devices and including interconnection lines. For example, the first semiconductor chip 10 may be a semiconductor logic chip.

The mother substrate 1 may include a top surface 2a and a bottom surface 4a facing each other. The mother substrate 1 may include protrusion patterns 25a. The protrusion patterns 25a may be a portion of the mother substrate 1. For example, the protrusion patterns 25a may be formed of silicon included in a bulk silicon mother substrate 1. The protrusion patterns 25a may be disposed on corner portions of the mother substrate 1 and protrude from the top surface 2a of the mother substrate 1. For example, there may be four protrusion patterns 25a, each only formed in a corner and separated from the other protrusion patterns 25a. For example, while the mother substrate 1 may be raised (e.g., protruding) in the corners, it may be flat, and have the same height as a central portion of the top surface of the mother substrate 1 in remaining surrounding edge portions of the mother substrate 1. Top surfaces 12a of the protrusion patterns 25a may be positioned higher than the top surface 2a of the mother substrate 1. For example, the protrusion patterns 25a may have an outer surface aligned with a side surface of the mother substrate 1. The protrusion patterns 25a may include, for example, silicon.

The insulation pattern 205a may be disposed on the top surface 2a of the mother substrate 1. The insulation pattern 205a may have a top surface positioned lower than the top surfaces 12a of the protrusion patterns 25a. The insulation pattern 205a may have a thickness less than those of the protrusion patterns 25a. The thickness of the protrusion pattern 25a may be defined as a vertical distance between the top surface 2a of the mother substrate 1 and the top surface 12a of the protrusion pattern 25a. For example, the thickness of the protrusion pattern 25a may be a distance between the top surface 2a of the mother substrate 1 and the top surface 12a of the protrusion pattern 25a in a direction perpendicular to the top surface 2a and/or the top surface 12a. The insulation patterns 205a may include, for example, a silicon oxide layer. Both the top surface 2a and the top surface 12a may be considered a top surface of the mother substrate 1, wherein the top surface 12a is a top-most surface of the mother substrate 1, formed at edge regions of the first semiconductor chip 10, and the top surface 2a is a central top surface formed at a central region of the first semiconductor chip 10.

The first through vias 201 may be disposed in the mother substrate 1. The first through vias 201 may penetrate the mother substrate 1 and the insulation pattern 205a. As shown in figures, the first through vias 201 may have a top surface positioned higher than that of the insulation pattern 205a. Alternatively, the first through vias 201 may have a top surface positioned at substantially the same level as that of the insulation pattern 205a (not shown in figures). For example, the top surfaces of the first through vias 201 may be positioned at substantially the same level as the top surfaces 12a of the protrusion patterns 25a. Alternatively, the top surfaces of the first through vias 201 may be positioned lower than the top surfaces 12a of the protrusion patterns 25a.

The upper pads 214 may be disposed on the first through vias 201. The upper pads 214 may be electrically connected to the first through vias 201. The lower pads 210 may be disposed on the bottom surface 4a of the mother substrate 1. In certain embodiments, an insulation layer may be formed between the lower pads 210 and the second surface 4a of the mother substrate 1 as shown in FIG. 10. For example, an insulation layer may be formed on the second surface 4a of the mother substrate 1, and the lower pads 210 may be formed on the insulation layer. The lower pads 210 may be electrically connected to the first through vias 201, and may further be electrically connected to the upper pads 214 through the first through vias 201. The terminals 212 may be disposed on bottom surfaces of the lower pads 210. The terminals 212 may be electrically connected to the lower pads 210 and the first through vias 201.

The second semiconductor chips 20 may be disposed on the top surface of the insulation pattern 205a. A lowermost second semiconductor chip 20 may be mounted on the top surface 2a of the mother substrate 1 in a flip-chip bonding manner, and the second semiconductor chips 20 may be vertically bonded to each other in a flip-chip bonding manner. In a plan view, the second semiconductor chips 20 may be disposed laterally spaced apart from the protrusion patterns 25a. The second semiconductor chips 20 may be a semiconductor memory chip (e.g., DRAM). Therefore, the chip stack package 200 may have a structure in which a plurality of semiconductor memory chips are vertically stacked on a semiconductor logic chip (e.g., the first semiconductor may be a semiconductor logic chip). Second through vias 244 may penetrate the second semiconductor chips 20 except for an uppermost second semiconductor chip 20. (e.g., the uppermost second semiconductor chip 20 may not have a second through via.) For example, the uppermost second semiconductor chip 20 may be formed of bulk silicon in a portion corresponding to the second through vias 244 of non-uppermost second semiconductor chips 20.

Lower solder balls 246 may be disposed between the lowermost second semiconductor chip 20 and the top surface 2a of the mother substrate 1. The lower solder balls 246 may electrically connect the first semiconductor chip 10 with the second semiconductor chips 20. For example, the first semiconductor chip 10 may include a portion of the mother substrate 1. Upper solder balls 242 may be interposed between the second semiconductor chips 20. For example, the upper solder balls 242 may be interposed between respective two second semiconductor chips 20. The upper solder balls 242 may electrically connect the second semiconductor chips 20 to each other. A molding layer 248 may be disposed on the mother substrate 1 and the insulation pattern 205a. The molding layer 248 may be interposed between the lowermost second semiconductor chip 20 and the mother substrate 1, and may be formed on sidewalls of the second semiconductor chips 20 and on a top surface of the uppermost second semiconductor chip 20. The various solder balls described herein may be referred to as terminals. In some cases, as can be seen in the various figures, the solder balls are external connection chip terminals for chips to communicate with the outside of the chips.

Referring back to FIG. 8, the signal processing device 400 may be mounted on the interposer substrate 100. The signal processing device 400 may be adhered to the interposer substrate 100 in a flip-chip bonding manner. The signal processing device 400 may be a central processing unit (CPU), a graphic processing unit (GPU), or a system-on-chip (SOC). The signal processing device 400 may be electrically connected to the chip stack package 200 through the interconnection lines 101 disposed in the interposer substrate 100.

The package substrate 600 may be disposed below the interposer substrate 100. The interposer substrate 100 may be mounted on the package substrate 600 in a flip-chip bonding manner. The package substrate 600 may be a printed circuit board (PCB). The package substrate 600 may be electrically connected to the chip stack package 200 and the signal processing device 400 through the interposer terminals 104 provided on a bottom surface of the interposer substrate 100.

FIGS. 11A to 11E are cross-sectional views illustrating a method for fabricating a chip stack package according to exemplary embodiments of the present inventive concept.

Figure 11A:
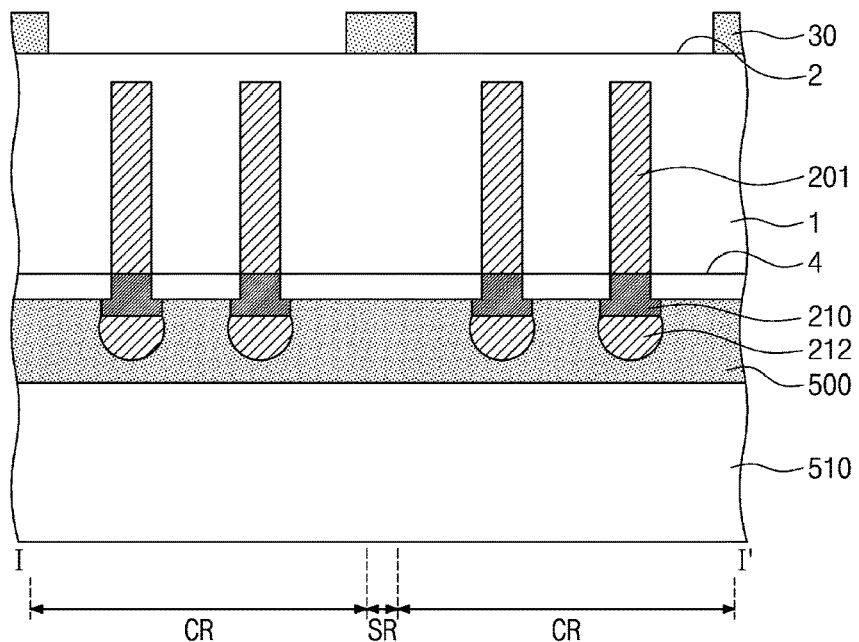
FIGS. 11A to 11E are cross-sectional views illustrating a method for fabricating a chip stack package according to exemplary embodiments of the present inventive concept.

Referring to FIG. 11A, a mother substrate 1 may be provided to include a first surface 2 and a second surface 4 facing each other. The first surface 2 of the mother substrate 1 may correspond to a surface on which second semiconductor chips 20 are mounted in a subsequent process. The mother substrate 1 may be a silicon substrate or a printed circuit board. First through vias 201 may be formed in the mother substrate 1. The first through vias 201 may be disposed in chip regions CR. The first through vias 201 may include a conductive material such as a semiconductor material (e.g., silicon) or a metal material (e.g., copper). Lower pads 210 may be formed on the second surface 4 of the mother substrate 1. For example, an insulation layer may be formed on the mother substrate 1, and the lower pads 210 may be formed on the insulation layer. The insulation layer may have holes through which the lower pads 210 may be electrically coupled to the first through vias 201. The lower pads 210 may be provided to correspond to the first through vias 201, and may be electrically connected to the first through vias 201. For example, the lower pads 210 may overlap with the first through vias 201 in a plan view. Terminals 212 may be disposed on the lower pads 210, and electrically connected to the first through vias 201 through the lower pads 210.

An adhesive film 500 may be provided on the second surface 4 of the mother substrate 1 so as to cover the lower pads 210 and terminals 212. A support substrate 510 may be adhered to the adhesive film 500. The adhesive film 500 may protect the lower pads 210 and the terminals 212 and fix the support substrate 510 on the mother substrate 1 during the fabrication process. The adhesive film 500 may fix the support substrate 510 on the mother substrate 1, so that the mother substrate 1 may be easily handled during the fabrication process. Resist patterns 30 may be formed on the first surface 2 of the mother substrate 1. The resist patterns 30 may be formed on scribing regions SR surrounding the chip regions CR.

Figure 11B:
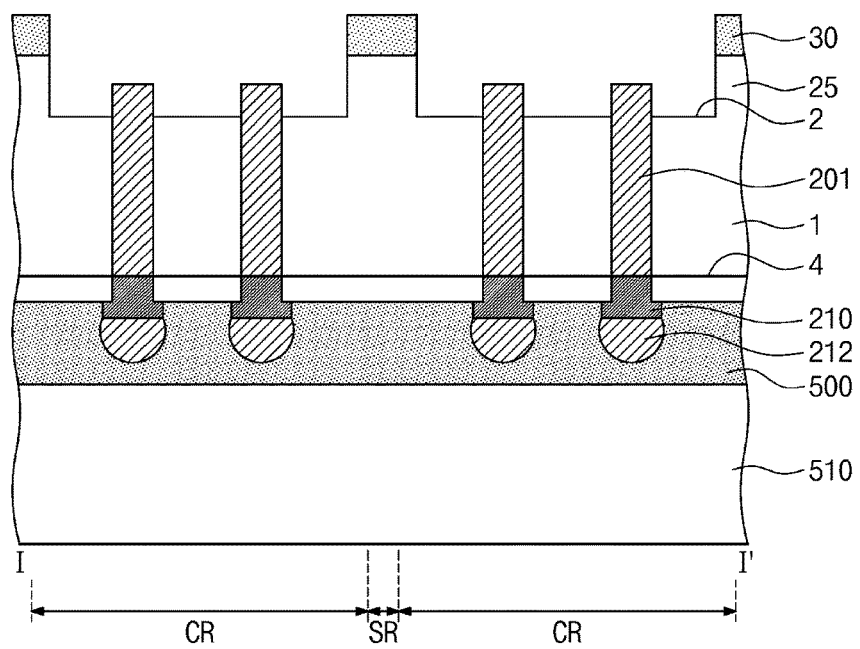

Referring to FIG. 11B, an etch process may be performed to etch the mother substrate 1 using the resist patterns 30 as an etching mask. The etch process may recess the first surface 2 of the mother substrate 1 such that upper portions of the first through vias 201 are exposed from the first surface 2 of the mother substrate 1. As a result of the etch process, portions of the mother substrate 1 that are below the resist patterns 30 may have a shape protruding from the first surface 2 of the mother substrate 1. The protruding portions of the mother substrate 1 may be alignment patterns 25 used as a reference mark for aligning lower solder balls (see 246 of FIG. 11E) with the first through vias 201. The alignment patterns 25 may have various shapes such as a cross shape, a rectangular shape, or a polygonal shape. The etch process may be a dry etch process. After the etch process, the resist patterns 30 may be removed. The removal of the resist patterns 30 may expose top surfaces of the alignment patterns 25.

In some embodiments, an etch process for exposing the first through vias 201 may be carried out simultaneously with a patterning process for patterning the mother substrate 1 to form the alignment patterns 25, thereby reducing number of steps of the etch process of the mother substrate 1. In this case, the alignment patterns 25 may have a shape vertically protruding from the first surface 2 of the mother substrate 1. Reduction of the number of etch process steps may cut down the cost for fabricating a semiconductor package.

Figure 11C:
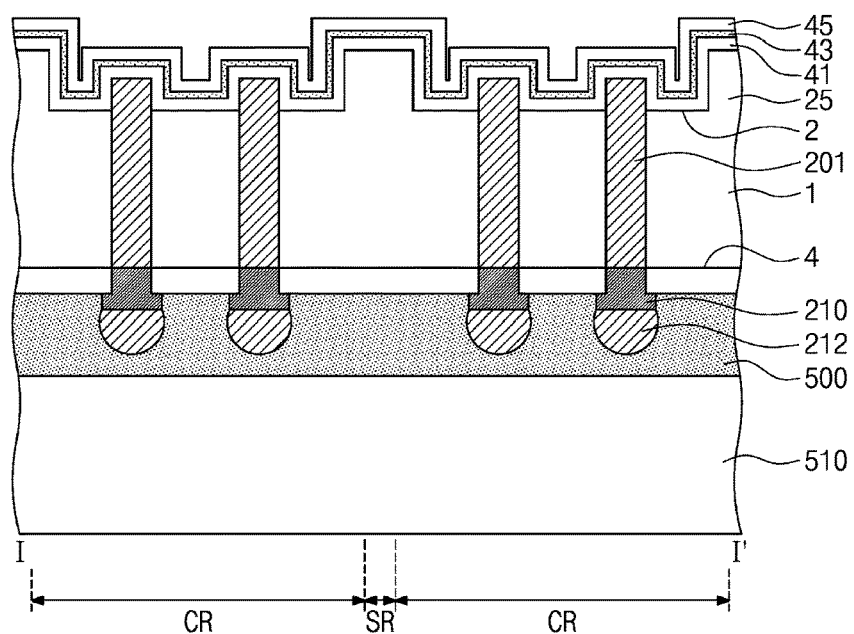

Referring to FIG. 11C, a first insulation layer 41, a second insulation layer 43, and a third insulation layer 45 may be sequentially formed on the first surface 2 of the substrate 1. The first insulation layer 41 may conformally cover the first surface 2 of the mother substrate 1, top and side surfaces of the first through vias 201 exposed through the mother substrate 1, and top and side surfaces of the alignment patterns 25. The second insulation layer 43 may conformally cover a top surface of the first insulation layer 41, and the third insulation layer 45 may conformally cover a top surface of the second insulation layer 43. The first and third insulation layers 41 and 45 may include a silicon oxide layer, and the second insulation layer 43 may include a silicon nitride layer.

Figure 11D:
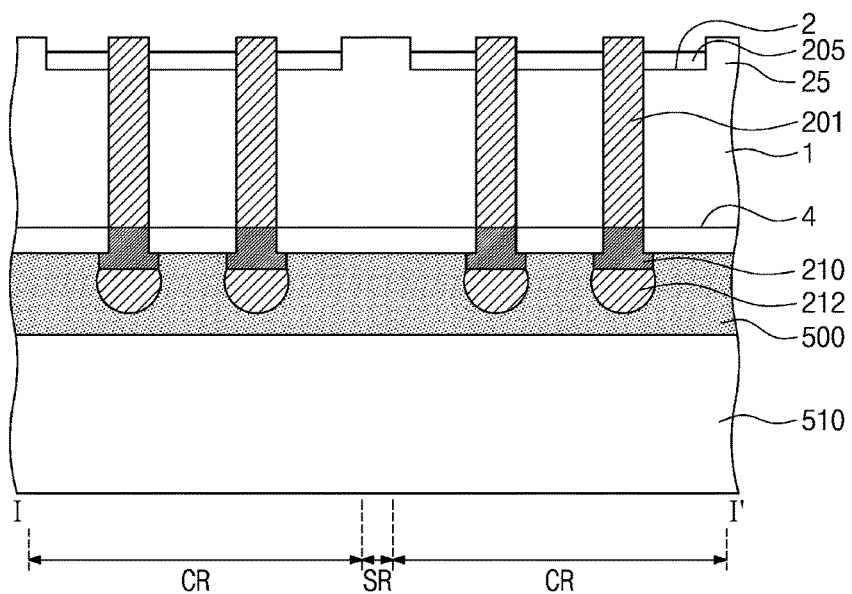

Referring to FIG. 11D, the first to third insulation layers 41, 43, 45 may be partially etched to form an insulation pattern 205 on the first surface 2 of the mother substrate 1. The formation of the insulation pattern 205 may be carried out until exposing the top surface of the first insulation layer 41 formed on the first surface 2 of the mother substrate 1. The etch process may independently or simultaneously use an etch recipe for etching the third insulation layer 45, an etch recipe for etching the second insulation layer 43, an etch recipe for etching the first insulation layer 41, and an etch recipe for etching the first through vias 201. For example, when etching the second insulation layer 43 formed on the first surface 2 of the mother substrate 1, the etch process may be carried out using the etch recipe for etching the second insulation layer 43 and/or the etch recipe for etching the first through vias 201. In this case, as the first insulation layer 41 includes a material having an etch selectivity with respect to the second insulation layer 43, the etch recipe for etching the second insulation layer 43 may not etch the first insulation layer 41 formed on the first surface 2. For example, the second insulation layer 43 may be used as an etch stop layer protecting the first insulation layer 41 formed on the first surface 2 of the mother substrate 1 from etching or over-etching. A chemical mechanical polishing process may be employed as the etch process. For example, a portion of the first, second and third insulation layers 41, 43 and 45 may be removed by a chemical mechanical polishing process.

The etching of the first to third insulation layers 41, 43 and 45 may include a partial etching of the first through vias 201. For example, the top surfaces of the first through vias 201 may be exposed. For example, during the etching processes of the first to third insulation layers 41, 43 and 45, the top surfaces of the first through vias 201 may be exposed to an etchant, and a portion of the first through vias 201 may be removed by the etching processes. In case that an etch rate of the first through vias 201 is less than that of the second insulation layer 43, as shown in figures, the top surfaces of the first through vias 201 may be positioned higher than a top surface of the insulation pattern 205. For example, the upper portions of the first through vias 201 may protrude from the top surface of the insulation pattern 205. In case that an etch rate of the first through vias 201 is the same as that of the second insulation layer 43 (not shown in figures) the top surfaces of the first through vias 201 may be positioned at the same level as the top surface of the insulation pattern 205.

Figure 11E:
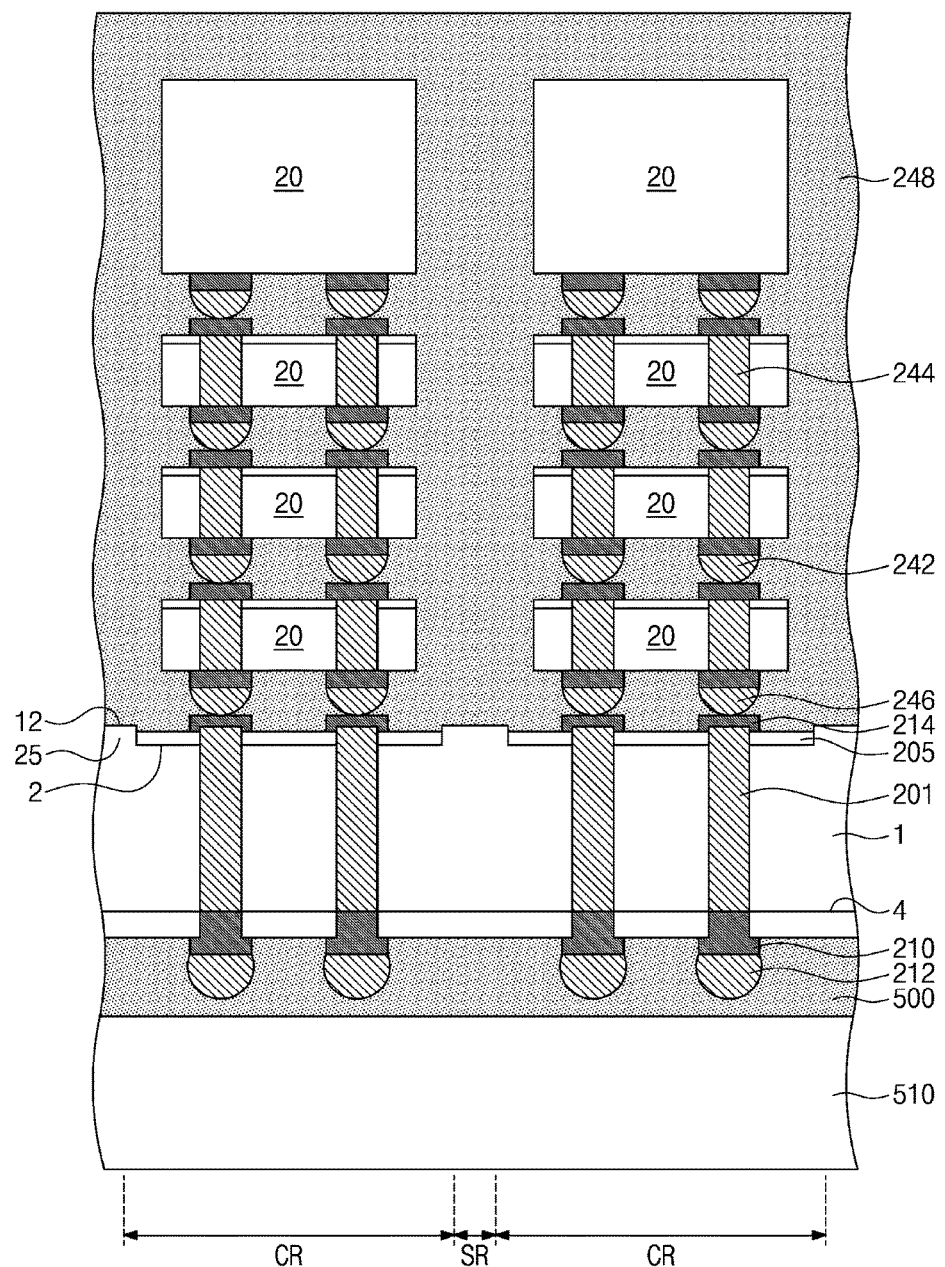

Referring to FIG. 11E, upper pads 214 may be formed on the first through vias 201. The upper pads 214 may be obtained by forming a metal layer (not shown) on the first through vias 201, the insulation pattern 205 and the alignment patterns 25, and then patterning the metal layer.

Second semiconductor chips 20 may be stacked on the upper pads 214. For example, a lowermost second semiconductor chip 20 may be adhered to the upper pads 214 in a flip-chip bonding manner, and a plurality of second semiconductor chips 20 may be sequentially adhered to the lowermost second semiconductor chip 20 in a flip-chip bonding manner. Alternatively, the second semiconductor chips 20 may first be adhered to each other in a flip-chip bonding manner, and then the upper pads 214 may be provided thereon with lower solder balls 246 formed on a bottom surface of the lowermost second semiconductor chip 20 on which a plurality of second semiconductor chips 20 are stacked. In this step, the alignment patterns 25 may be used as a reference mark such that the first through vias 201 may be aligned with the lower solder balls 246 formed on the bottom surface of the lowermost second semiconductor chip 20, and moreover upper solder balls 242 formed on bottom surfaces of the second semiconductor chips 20 may be aligned with second through vias 244 formed in the second semiconductor chips 20. For example, the alignment patterns 25 may be used to exactly place the second semiconductor chips 20 onto right positions where the second semiconductor chips 20 are electrically connected to the mother substrate 1. For example, the second semiconductor chips 20 may be transferred on the first surface 2 of the mother substrate 1, and then aligned so the solder balls 242 and 246 are electrically coupled to the circuitry formed in the mother substrate 1 using the alignment patterns 25. The alignment patterns 25 may be used, for example, with optical equipment that determines how to align the second semiconductor chips 20 with the mother substrate 1 based on the positions of the alignment patterns 25.

A molding layer 248 may be formed on the first surface 2 of the mother substrate 1 on which the second semiconductor chips 20 are stacked. The molding layer 248 may fill between the mother substrate 1 and the lowermost second semiconductor chip 20 and between the second semiconductor chips 20. The molding layer 248 may cover the top surface of the insulation pattern 205, top surfaces 12 and side surfaces of the alignment patterns 25, and side and top surfaces of the second semiconductor chips 20.

A sawing process may be performed to cut the mother substrate 1 and the molding layer 248 along the scribing regions SR. The sawing process may divide the mother substrate 1 into a plurality of first semiconductor chips (see 10 of FIG. 10) and, as shown in FIG. 10, a chip stack package 200 may be fabricated to include a single first semiconductor chip 10 and a plurality of second semiconductor chips 20 stacked on the single first semiconductor chip 10. After the sawing process, the adhesive film 500 and the support substrate 510 may be detached from the first semiconductor chip 10. For example, an adhesive force of the adhesive film 500 may be reduced to separate the adhesive film 500 from the first semiconductor chip 10, and thus the support substrate 510 may be removed from the first semiconductor chip 10.

In certain embodiments, a chip stack package 200 may include two or more first semiconductor chips 10. In this case, the first semiconductor chips 10 may be arranged horizontally, e.g., in a perpendicular direction with respect to the stack direction of the second semiconductor chips 20. For example, one or more second semiconductor chips 20 may be stacked on each of the first semiconductor chips 10 arranged horizontally. For example, a chip stack package 200 may include first semiconductor chips 10 arranged to be horizontally separated from each other, and include second semiconductor chips 20 stacked on the first semiconductor chips 10. In one embodiment, when two or more first semiconductor chips 10 are included in a chip stack package 200, the two or more first semiconductor chips 10 may not be physically separated, but may share a mother substrate 1. The two or more first semiconductor chips 10 may be structurally and/or functionally the same as, similar to, or different from each other.

According to exemplary embodiments of the present inventive concept, an etch process for exposing the through vias buried in the mother substrate may be performed simultaneously with a patterning process for patterning the mother substrate to form the alignment patterns. Therefore, the alignment patterns may have a shape protruding from the top surface of the mother substrate. Moreover, it may be advantageous to cut down the fabrication cost for semiconductor packages by merging individual processes, thereby carrying out merged individual processes in a single step.

Although the disclosure has been described in connection with the embodiments of the present inventive concept illustrated in the accompanying drawings, it is not limited thereto. The above-disclosed embodiments should thus be considered illustrative and not restrictive.

What is claimed is:

1. A circuit board, comprising:
a mother substrate including first and second scribing regions, the first scribing region extending in first direction, the second scribing region extending in second direction, the first and second directions crossing each other, the mother substrate including chip regions defined by the first and second scribing regions; and
a through via penetrating a first chip region of the mother substrate,
wherein the mother substrate comprises a first alignment pattern protruding from a top surface of the mother substrate, the first alignment pattern being disposed on at least one of the first and second scribing regions,
wherein a height of a top surface of the first alignment pattern is the same as or higher than a height of a top surface of the through via.

2. The circuit board of claim 1, further comprising an insulation pattern on a top surface of the mother substrate in the first chip region,
wherein the insulation pattern has a top surface positioned lower than the top surface of the first alignment pattern.

3. The circuit board of claim 1, wherein boundaries of the first and second scribing regions are marked by scribing marks, and the first alignment pattern has a maximum width greater than a width of the first and second scribing regions.

4. The circuit board of claim 1, further comprising:
a second alignment pattern,
wherein the second alignment pattern surrounds the first alignment pattern,
wherein the first alignment pattern and the second alignment pattern are spaced apart from each other, and
wherein the second alignment pattern has a top surface positioned at the same level as the top surface of the first alignment pattern.

5. The circuit board of claim 4, further comprising:
a first insulation pattern disposed on the top surface of the mother substrate in the first chip region; and
a second insulation pattern disposed on the top surface of the mother substrate between the first insulation pattern and the second insulation pattern,
wherein a thickness of the first insulation pattern is the same as a thickness of the second insulation pattern.

6. The circuit board of claim 5, wherein the first insulation pattern and the second insulation pattern comprise the same material.

7. The circuit board of claim 1, wherein the first alignment pattern is locally disposed on an intersection region where the first and second scribing regions cross each other.

8. The circuit board of claim 1, wherein the first alignment pattern is spaced apart from an intersection region where the first and second scribing regions cross each other.

9. A semiconductor package, comprising:
a first semiconductor chip including a mother substrate and a through via penetrating the mother substrate; and
a second semiconductor chip on the first semiconductor chip,
wherein the mother substrate comprises a protrusion pattern that is disposed on a corner portion of the mother substrate and protrudes from a top surface of the mother substrate.

10. The semiconductor package of claim 9, wherein the protrusion pattern is laterally spaced apart from the second semiconductor chip, in a plan view.

11. The semiconductor package of claim 9, wherein the mother substrate has a side surface aligned with an outer surface of the protrusion pattern.

12. The semiconductor package of claim 9, further comprising an insulation pattern on the top surface of the mother substrate,
wherein the insulation pattern has a top surface positioned lower than a top surface of the protrusion pattern.

13. The semiconductor package of claim 9, wherein
the first semiconductor chip comprises a semiconductor logic chip, and
the second semiconductor chip comprises a semiconductor memory chip.

14. The semiconductor package of claim 9, further comprising:
an interposer substrate on which the first and second semiconductor chips are mounted;

a signal processing device mounted on the interposer substrate and electrically connected to the first and second semiconductor chips; and a package substrate disposed below the interposer substrate and electrically connected to the first semiconductor chip, the second semiconductor chip, and the signal processing device through the interposer substrate.

15. A semiconductor device, comprising:

a first semiconductor chip comprising a first substrate, a protruding pattern protruding on the first substrate, and a first integrated circuit formed on the first substrate; and a second semiconductor chip comprising a second substrate and a second integrated circuit formed on the second substrate, wherein the second semiconductor chip is disposed on the first semiconductor chip, wherein the first integrated circuit is electrically coupled to the second integrated circuit, wherein the protruding pattern is formed from the same material as the first substrate, and wherein the protruding pattern is at one or more corners of the first semiconductor chip and is not formed at edge portions of the first semiconductor chip between the corners of the first semiconductor chip.

16. The semiconductor device of claim 15, wherein the protruding pattern is laterally spaced apart from the second semiconductor chip in a plan view.

17. The semiconductor device of claim 15, wherein the first substrate is formed of silicon.

18. The semiconductor device of claim 15, further comprising:

a third semiconductor chip comprising a third substrate and a third integrated circuit formed on the third substrate, the third semiconductor chip disposed on the second semiconductor chip, wherein the third integrated circuit is electrically coupled to the first and second integrated circuits.

19. The semiconductor device of claim 18, wherein the first semiconductor chip is a semiconductor logic chip, and the second and third semiconductor chips are semiconductor memory chips.

\* \* \* \* \*